US006985340B2

(12) United States Patent
Nojiri et al.

(10) Patent No.: US 6,985,340 B2
(45) Date of Patent: Jan. 10, 2006

(54) SEMICONDUCTOR DEVICE WITH PROTECTION CIRCUIT PROTECTING INTERNAL CIRCUIT FROM STATIC ELECTRICITY

(75) Inventors: Isao Nojiri, Hyogo (JP); Hiroyuki Murai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/648,390

(22) Filed: Aug. 27, 2003

(65) Prior Publication Data

US 2004/0174645 A1     Sep. 9, 2004

(30) Foreign Application Priority Data

Mar. 7, 2003  (JP) .............................. 2003-061735

(51) Int. Cl.
    *H02H 3/22* (2006.01)
(52) U.S. Cl. ....................................... 361/56; 361/111
(58) Field of Classification Search ................ 361/55, 361/56, 57, 90, 91.1, 92, 111, 54, 91.2; 257/360, 257/361, 362–365, 452, 457
    See application file for complete search history.

(56) References Cited

U.S. PATENT DOCUMENTS

| 5,936,687 A | * | 8/1999 | Lee .............................. 349/40 |
| 5,953,191 A | * | 9/1999 | Narita .......................... 361/56 |
| 5,973,901 A | * | 10/1999 | Narita et al. ................ 361/111 |
| 6,649,944 B2 | * | 11/2003 | Ker et al. ..................... 257/199 |
| 6,753,836 B2 | * | 6/2004 | Kwon .......................... 345/87 |

FOREIGN PATENT DOCUMENTS

| JP | 11-2839 A | 1/1999 |
| JP | 11-109410 A | 4/1999 |
| JP | 11-119257 A | 4/1999 |

* cited by examiner

*Primary Examiner*—Stephen W. Jackson
*Assistant Examiner*—Danny Nguyen
(74) *Attorney, Agent, or Firm*—McDermott Will & Emery LLP

(57) ABSTRACT

A protection circuit described herein protects an LCD module from static electricity generated at a first positive power supply terminal in a process of manufacturing the LCD module. The protection circuit includes four diodes connected in series between a first node connected to the first positive power supply terminal and a second node receiving a reference potential, and a diode connected between the second and first nodes. When a first positive power supply voltage (10V) is applied to the first positive power supply terminal, the four diodes do not conduct. Therefore, a current consumption of the LCD module can accurately be measured.

8 Claims, 6 Drawing Sheets

SEMICONDUCTOR DEVICE WITH PROTECTION CIRCUIT PROTECTING INTERNAL CIRCUIT FROM STATIC ELECTRICITY

BACKGROUND OF THE INVENTION

1. Field of the Invention

The present invention generally relates to a semiconductor device. More particularly, the present invention relates to a semiconductor device with a protection circuit protecting an internal circuit from static electricity generated at an input terminal.

2. Description of the Background Art

A conventional TFT (thin film transistor) of an active matrix type liquid crystal panel has been made of amorphous silicon. Recently, however, formation of a TFT from polysilicon has been under consideration. Conventionally, a scan line drive circuit or a data line drive circuit or the like has been configured of an LSI made of crystalline silicon and provided separately from a liquid crystal panel made of amorphous silicon. Since a mobility of polysilicon is approximately 100 times higher than that of amorphous silicon, however, a liquid crystal panel, a scan line drive circuit, a data line drive circuit or the like can be made of polysilicon to obtain one LCD (liquid crystal display) module.

A polysilicon TFT, however, exhibits a wide variation in TFT characteristics such as a threshold voltage or a mobility. Thus, a wide variation in a current consumption of the LCD module results. Therefore, it is of the utmost importance to accurately inspect whether or not the current consumption of the LCD module satisfies the standard value.

In a conventional array inspection, after charging a capacitor provided corresponding to each liquid crystal cell, a discharge current is detected. Based on a result of the detection, an inspection is performed as to whether or not the array is normal. The inspection time, however, can significantly be reduced, if the current consumption of the LCD module is inspected prior to this array inspection so that the conventional array inspection can be omitted when the inspection of the current consumption detects an unsatisfactory value. In this sense as well, an accurate detection of the current consumption of the LCD module is important.

Furthermore, a gate oxide film of the polysilicon TFT is thinner than that of an amorphous silicon TFT. Accordingly, the gate oxide film of the polysilicon TFT is more susceptible to damage from static electricity. As a method of preventing damage to the TFT from static electricity in an array manufacturing process, a method of short-circuiting terminals has been provided.

As a method of applying a voltage to a terminal in an array inspection as well as preventing damage to a TFT from static electricity, the following have been provided, i.e., a method of connecting a resistance element between each terminal and a conductor pattern, and a method of connecting two diodes in opposite directions in parallel between each terminal and a conductor pattern (see, for example, Japanese Patent Laying-Open No. 11-119257).

In order to accurately measure the current consumption of the LCD module, a resistance value of a resistance element or a diode needs to be high. The high resistance value of the resistance element or the diode, however, makes it difficult to flow static electricity out. This results in the LCD module having a low resistance to static electricity.

SUMMARY OF THE INVENTION

An object of the present invention is to provide a semiconductor device the current consumption of which can accurately be measured and which is highly resistant to static electricity.

A semiconductor device in accordance with the present invention includes a first input terminal receiving a first positive voltage externally in an inspection of the semiconductor device and a normal operation of the semiconductor device, an internal circuit connected to the first input terminal and performing a prescribed operation, and a first protection circuit protecting the internal circuit from static electricity generated at the first input terminal. The first protection circuit includes a plurality of first diode elements connected in series between the first input terminal and a line of a reference potential and conducting in response to a voltage of the first input terminal exceeding a second positive voltage higher than the first positive voltage, and a second diode element connected between the line of the reference potential and the first input terminal. Accordingly, when the first positive voltage is applied to the first input terminal in the inspection, the plurality of first diode elements do not conduct. Therefore, a current consumption of the semiconductor device can accurately be measured. Furthermore, when the voltage of the first input terminal exceeds the second positive voltage higher than the first positive voltage, the plurality of first diode elements conduct. As a result, a reliable protection of the internal circuit from the static electricity can be ensured.

Another semiconductor device in accordance with the present invention includes an input terminal receiving a first negative voltage externally in an inspection of the semiconductor device and a normal operation of the semiconductor device, an internal circuit connected to the input terminal and performing a prescribed operation, and a protection circuit protecting the internal circuit from static electricity generated at the input terminal. The protection circuit includes a plurality of first diode elements connected in series between a line of a reference potential and the input terminal and conducting in response to a voltage of the input terminal going lower than a second negative voltage lower than the first negative voltage, and a second diode element connected between the input terminal and the line of the reference potential. Accordingly, when the first negative voltage is applied to the input terminal in the inspection, the plurality of first diode elements do not conduct. Therefore, a current consumption of the semiconductor device can accurately be measured. In addition, when the voltage of the input terminal exceeds the second negative voltage lower than the first negative voltage, the plurality of first diode elements conduct. As a result, a reliable protection of the internal circuit from the static electricity can be ensured.

A further semiconductor device in accordance with the present invention includes an input terminal receiving externally a voltage of at most a first positive voltage and at least a first negative voltage in an inspection of the semiconductor device and a normal operation of the semiconductor device, an internal circuit connected to the input terminal and performing a prescribed operation, and a protection circuit protecting the internal circuit from static electricity generated at the input terminal. The protection circuit includes a plurality of first diode elements connected in series between the input terminal and a line of a reference potential line and conducting in response to a voltage of the input terminal exceeding a second positive voltage higher than the first positive voltage, and a plurality of second diode elements connected in series between the line of the reference potential and the input terminal and conducting in response to the voltage of the input terminal going lower than a second negative voltage lower than the first negative voltage. Accordingly, when the voltage of at most the first positive voltage and at least the first negative voltage is applied to the input terminal in the inspection, the plurality of first diode elements and the plurality of second diode elements do not conduct. Therefore, a current consumption of the semiconductor device can accurately be measured. In addition, when the voltage of the input terminal exceeds the second positive voltage higher than the first positive voltage and when the voltage of the input terminal exceeds the second negative voltage lower than the first negative voltage, the plurality of first diode elements and the plurality of second diode elements conduct, respectively. As a result, a reliable protection of the internal circuit from static electricity can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
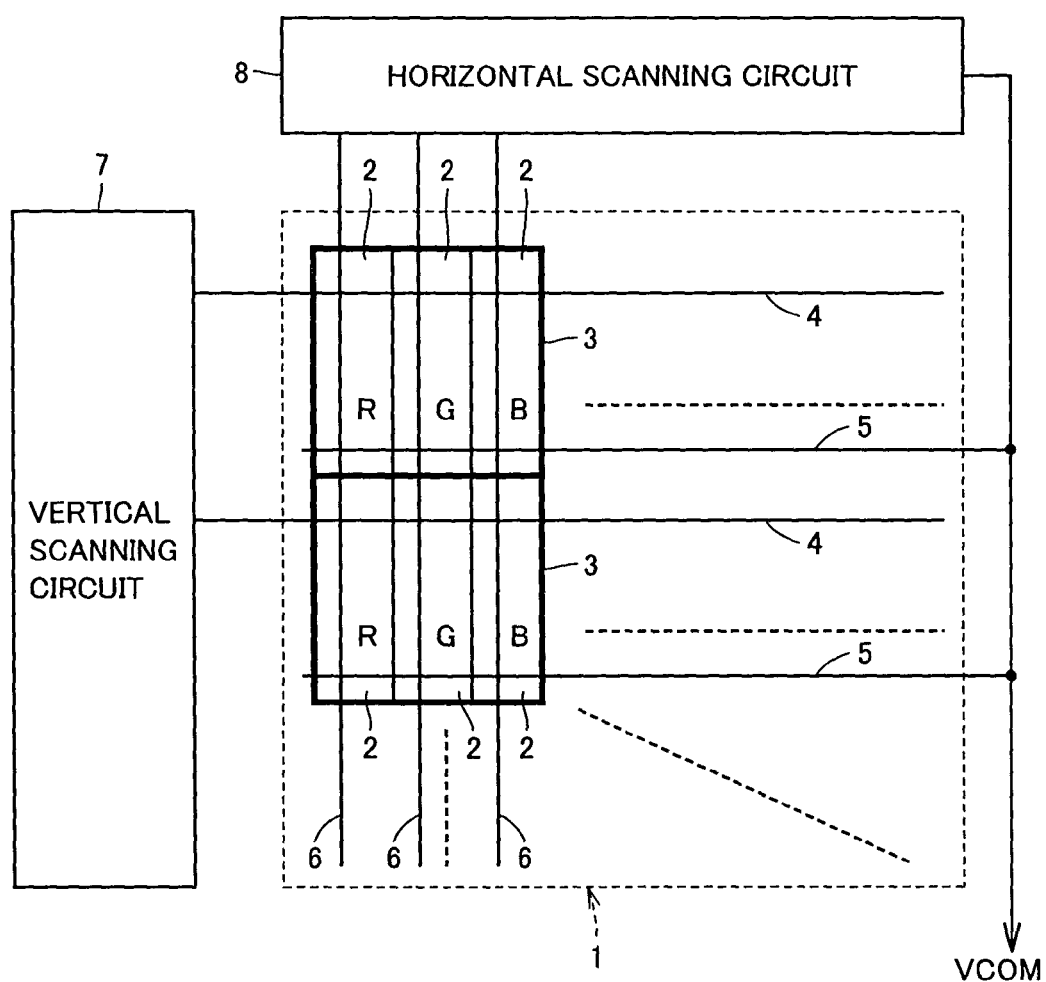
FIG. 1 is a block diagram showing an overall configuration of a color liquid crystal display device in accordance with one embodiment of the present invention.

FIG. 1 is a block diagram showing a configuration of a color liquid crystal display device in accordance with one embodiment of the present invention. In FIG. 1, the color liquid crystal display device includes a pixel array portion 1, a vertical scanning circuit 7, and a horizontal scanning circuit 8, and is provided for a mobile phone, for example.

Pixel array portion 1 includes a plurality of liquid crystal cells 2 arranged in a plurality of rows and columns, a plurality of scan lines 4 respectively provided corresponding to the plurality of rows, a plurality of common potential lines 5 respectively provided corresponding to the plurality of rows, and a plurality of data lines 6 respectively provided corresponding to the plurality of columns. The plurality of common potential lines 5 are connected to each other.

Liquid crystal cells 2 are previously grouped together in threes at each row. Three liquid crystal cells 2 in each group are provided with color filters of R, G, and B, respectively. Three liquid crystal cells 2 in each group constitute one pixel 3.

Figure 2:
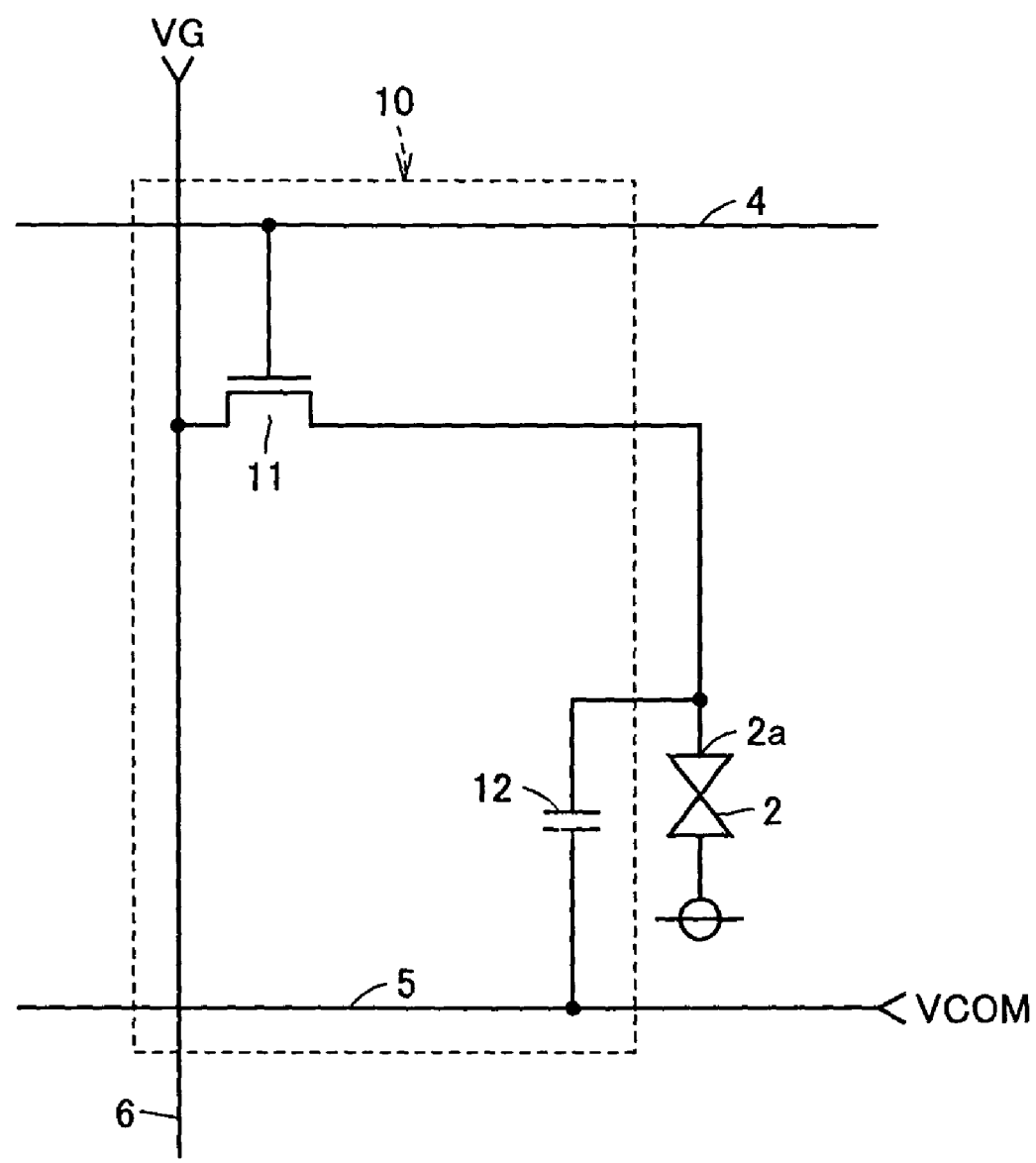
FIG. 2 is a circuit diagram showing a configuration of a liquid crystal drive circuit provided corresponding to each liquid crystal cell shown in FIG. 1.

As shown in FIG. 2, each liquid crystal cell 2 is provided with a liquid crystal drive circuit 10. Liquid crystal drive circuit 10 includes an N type TFT 11 and a capacitor 12. N type TFT 11 is connected between data line 6 and one electrode 2a of liquid crystal cell 2. N type TFT 11 has its gate connected to scan line 4. Capacitor 12 is connected between one electrode 2a of liquid crystal cell 2 and common potential line 5. A common potential VCOM is applied to common potential line 5. The other electrode of liquid crystal cell 2 is connected to an opposite electrode. A potential same as common potential VCOM is generally applied to the opposite electrode.

Referring back to FIG. 1, vertical scanning circuit 7 operates in response to an image signal to select the plurality of scan lines 4 sequentially, each for a prescribed period of time, and set the selected scan line 4 to an H level of a selected level. When scan line 4 is raised to the H level of the selected level, N type TFT 11 in FIG. 2 conducts. Then, one electrode 2a of each liquid crystal cell 2 corresponding to that scan line 4 and data line 6 corresponding to that liquid crystal cell 2 are coupled.

While one scan line 4 is selected by vertical scanning circuit 7 in accordance with the image signal, horizontal scanning circuit 8 applies a graduation potential VG to each data line 6 and also applies common potential VCOM to common potential line 5. A light transmittance of liquid crystal cell 2 varies depending on a voltage between the electrodes.

When all the liquid crystal cells 2 in pixel array portion 1 are scanned by vertical scanning circuit 7 and horizontal scanning circuit 8, one color image is displayed at pixel array portion 1.

Figure 3:
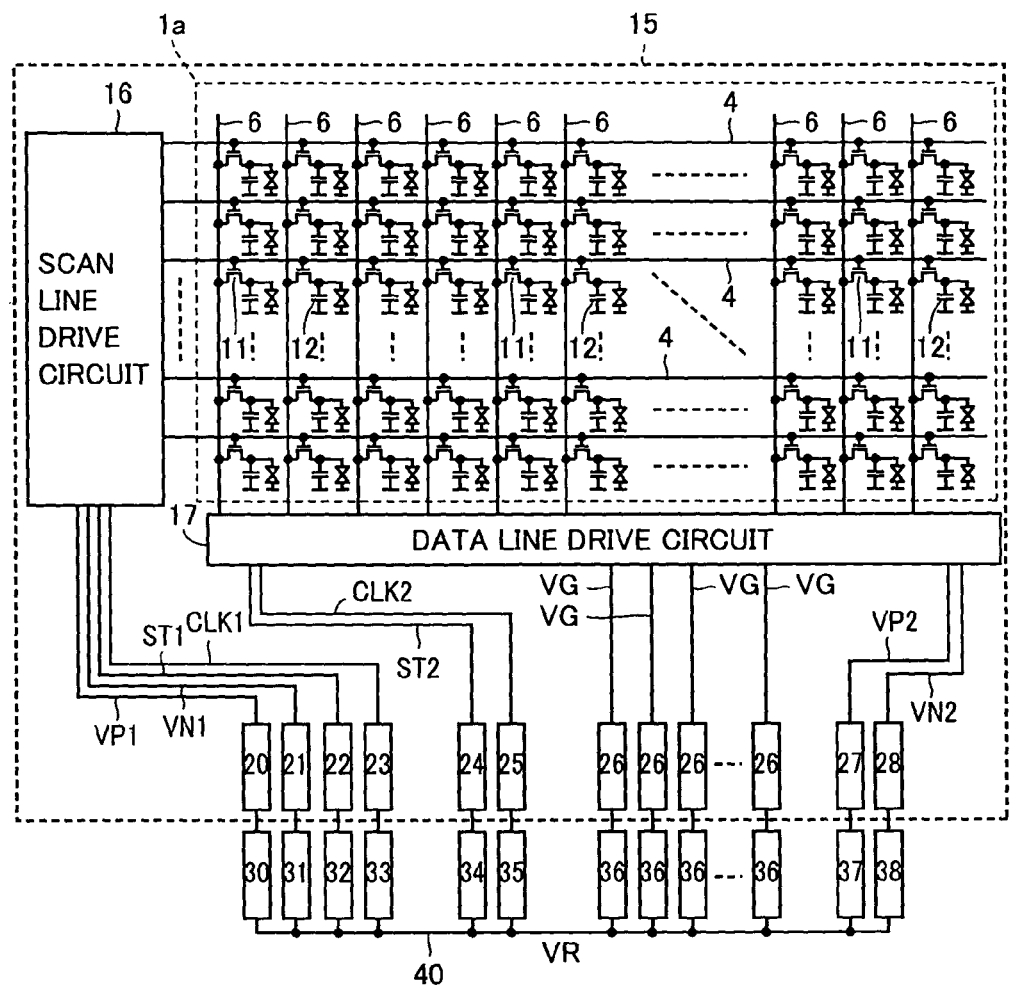
FIG. 3 is a circuit block diagram for describing a method of inspecting the color liquid crystal display device shown in FIG. 1.

FIG. 3 is a circuit block diagram for describing a method of inspecting the color liquid crystal display device shown in FIGS. 1 and 2. In FIG. 3, in this inspection method, an LCD module 15 that is a color liquid crystal display device assembly, a plurality of protection circuits 30 to 38, and a reference potential line 40 are provided at a surface of a glass substrate (not shown).

LCD module 15 includes a TFT array 1a, a scan line drive circuit 16, a data line drive circuit 17, a first positive power supply terminal 20, a first negative power supply terminal 21, a first start terminal 22, a first clock terminal 23, a second start terminal 24, a second clock terminal 25, a plurality of data terminals 26, a second positive power supply terminal 27, and a second negative power supply terminal 28 provided within a region of the quadrangular module.

TFT array 1a includes the plurality of scan lines 4, the plurality of data lines 6, a plurality of N type TFTs 11, a plurality of capacitors 12, and one electrodes of liquid crystal cells 2 formed on the glass substrate. At each crossing point of scan line 4 and data line 6, a set of N type TFT 11, capacitor 12, and one electrode of liquid crystal cell 2 are provided. A liquid crystal panel is produced by introducing liquid crystal between the TFT array substrate and another glass substrate. Another glass substrate is provided with an electrode opposite to one electrode of liquid crystal cell 2 and a color filter.

Scan line drive circuit 16 is a part of vertical scanning circuit 7. Scan line drive circuit 16 is driven by a first positive power supply voltage VP1 and a first negative power supply voltage VN1 applied through terminals 20 and 21. Scan line drive circuit 16 operates in synchronization with a first start signal ST1 and a first clock signal CLK1 applied through terminals 22 and 23. Scan line drive circuit 16 sequentially selects the plurality of scan lines 4 and raises the selected scan line to the H level of the selected level.

Data line drive circuit 17 is a part of horizontal scanning circuit 8. Data line drive circuit 17 is driven by a second positive power supply voltage VP2 and a second negative power supply voltage VN2 applied through terminals 27 and 28. Data line drive circuit 17 operates in synchronization with a second start signal ST2 and a second clock signal CLK2 applied through terminals 24 and 25. While one scan line 4 is selected, data line drive circuit 17 writes a plurality of graduation potentials VGs applied through the plurality of data terminals 26 to a plurality of liquid crystal cells 2 corresponding to the selected scan line 4.

Terminals 20 to 25, 27, 28, and the plurality of data terminals 26 are provided along one side of the quadrangular module region and arranged with a prescribed pitch therebetween. Each of terminals 20 to 28 is, in an inspection, connected to an inspection device via a probe. After the inspection, each of terminals 20 to 28 is connected to an FPC (flexible printed circuit board).

The plurality of protection circuits 30 to 38 are provided externally to the module region. The plurality of protection circuits 30 to 38 are provided respectively corresponding to terminals 20 to 28. Each of protection circuits 30 to 38 is connected between a corresponding terminal and reference potential line 40. Each of protection circuits 30 to 38 flows static electricity generated at the corresponding terminal to reference potential line 40 to protect LCD module 15. Reference potential line 40 is connected to a terminal for a reference potential (e.g. a ground potential GND terminal). A reference potential VR (e.g. a ground potential GND) is applied to reference potential line 40.

Figure 4A:
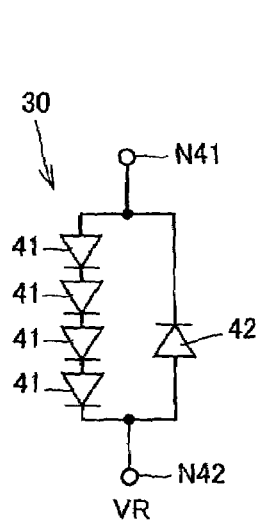
FIGS. 4A–4C are circuit diagrams showing a configuration of a protection circuit 30 in FIG. 3.

FIG. 4A is a circuit diagram showing a configuration of protection circuit 30. In FIG. 4A, protection circuit 30 includes four diodes 41 connected in series between nodes N41 and N42, and a diode 42 connected between nodes N42 and N41. Node N41 is connected to first positive power supply terminal 20. Node N42 is connected to reference potential line 40.

Figure 4B:
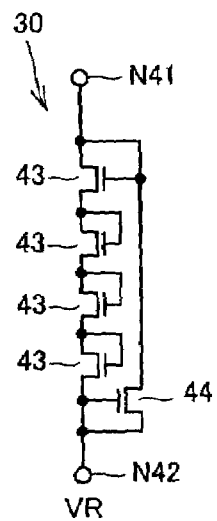
Figure 4C:
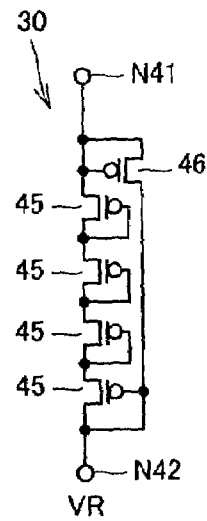

Diodes 41 and 42 may be N type TFTs 43 and 44 as shown in FIG. 4B, or may be P type TFTs 45 and 46 as shown in FIG. 4C. A TFT having its gate and drain connected together forms a diode. A threshold voltage Vth of each of diodes 41 and 42 is set at 3V.

To check a current in an array inspection, first power supply voltage VP1, i.e. 10V, is applied to first positive power supply terminal 20. At this time, diodes 41 and 42 are kept non-conductive. Therefore, a current flowing from first positive power supply terminal 20 to LCD module 15 can accurately be measured. When positive static electricity is generated at terminal 20 and a voltage of terminal 20 reaches at least 12V, four diodes 41 conduct. Then, the positive static electricity flows to reference potential line 40. Furthermore, when negative static electricity is generated at terminal 20 and the voltage of terminal 20 reaches at most 3V, diode 42 conducts. Then, the negative static electricity is erased by a current from reference potential line 40. Therefore, damage to LCD module 15 from the static electricity can be prevented. Protection circuits 32 to 35, and 37 are the same in configuration as protection circuit 30. In checking a current, 10V or 0V is applied to each of terminals 32 to 35, and 37.

Figure 5A:
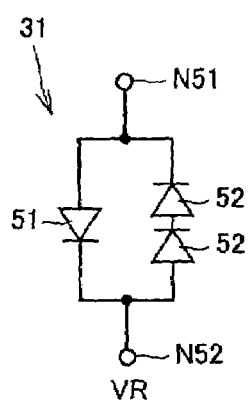
FIGS. 5A–5C are circuit diagrams showing a configuration of a protection circuit 31 in FIG. 3.

FIG. 5A is a circuit diagram showing a configuration of protection circuit 31. In FIG. 5A, protection circuit 31 includes a diode 51 connected between nodes N51 and N52, and two diodes 52 connected in series between nodes N52 and N51. Node N51 is connected to first negative power supply terminal 21. Node N52 is connected to reference potential line 40.

Figure 5B:
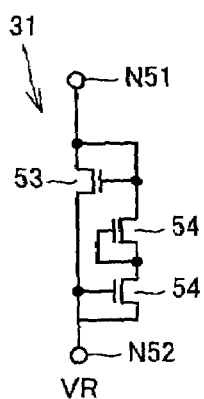
Figure 5C:
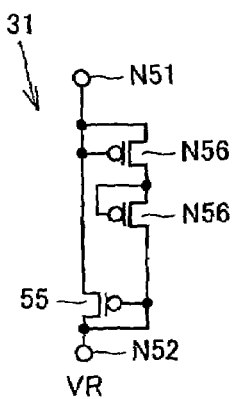

Diodes 51 and 52 may be N type TFTs 53 and 54 as shown in FIG. 5B, or may be P type TFTs 55 and 56 as shown in FIG. 5C. A TFT having its gate and drain connected together forms a diode. Threshold voltage Vth of each of diodes 51 and 52 is set at 3V.

To check a current in the array inspection, first negative power supply voltage VN1, i.e. −5V, is applied to first negative power supply terminal 21. At this time, diodes 51 and 52 are kept non-conductive. Therefore, a current flowing from first negative power supply terminal 21 to LCD module 15 can accurately be measured. When negative static electricity is generated at terminal 21 and a voltage of terminal 21 reaches at most −5V, two diodes 52 conduct. Then, the negative static electricity is erased by a current from reference potential line 40. Furthermore, when positive static electricity is generated at terminal 21 and the voltage of terminal 21 reaches at least 3V, diode 51 conducts. Then, the positive static electricity flows to reference potential line 40. Therefore, damage to LCD module 15 from the static electricity can be prevented. Protection circuit 38 is the same in configuration as protection circuit 31. In checking a current, −5V is applied to terminal 28 as well.

Figure 6A:
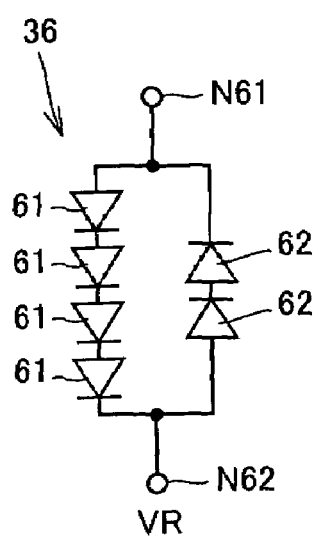
FIGS. 6A–6C are circuit diagrams showing a configuration of a protection circuit 36 in FIG. 3.

FIG. 6A is a circuit diagram showing a configuration of protection circuit 36. In FIG. 6A, protection circuit 36 includes four diodes 61 connected in series between nodes N61 and N62, and two diodes 62 connected between nodes N62 and N61. Node N61 is connected to data terminal 26. Node N62 is connected to reference potential line 40.

Figure 6B:
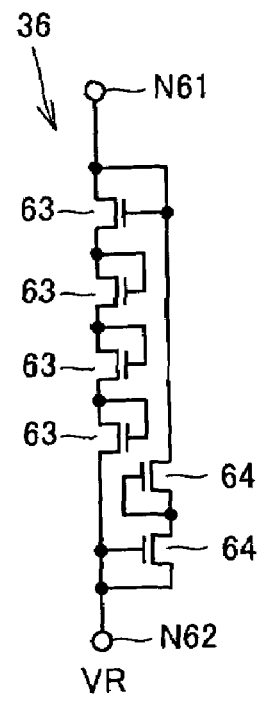
Figure 6C:
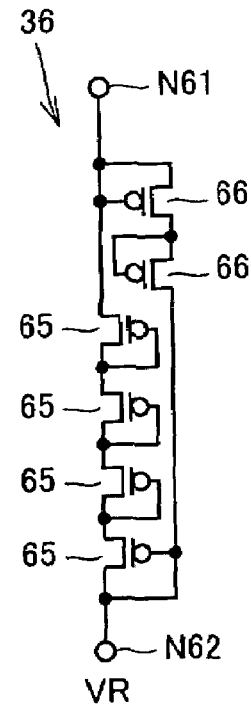

Diodes 61 and 62 may be N type TFTs 63 and 64 as shown in FIG. 6B, or may be P type TFTs 65 and 66 as shown in FIG. 6C. A TFT having its gate and drain connected together forms a diode. Threshold voltage Vth of each of diodes 61 and 62 is set at 3V.

To check a current in the array inspection, an upper limit of graduation potential VG, i.e. 10V, and a lower limit of graduation potential VG, i.e. −5V, are applied to data terminal 26. At this time, diodes 61 and 62 are kept non-conductive. Therefore, a current flowing from data terminal 26 to LCD module 15 can accurately be measured. When positive static electricity is generated at terminal 26 and a voltage of terminal 26 reaches at least 12V, four diodes 61 conduct. Then, the positive static electricity flows to reference potential line 40. Furthermore, when negative static electricity is generated at terminal 26 and the voltage of terminal 26 reaches at most 6V, two diodes 62 conduct. Then, the negative static electricity is erased by a current from reference potential line 40. Therefore, damage to LCD module 15 from the static electricity can be prevented.

Referring back to FIG. 3, after the inspection is completed, LCD module 15 and a corresponding glass substrate portion are removed from the glass substrate. At this time, terminals 20 to 28 are separated from protection circuits 30 to 38. Thereafter, another glass substrate is placed on a surface of TFT array 1a with liquid crystal interposed to form pixel array portion 1. Furthermore, terminals 20 to 28 are connected to FPC. The color liquid crystal display device is completed.

Figure 7:
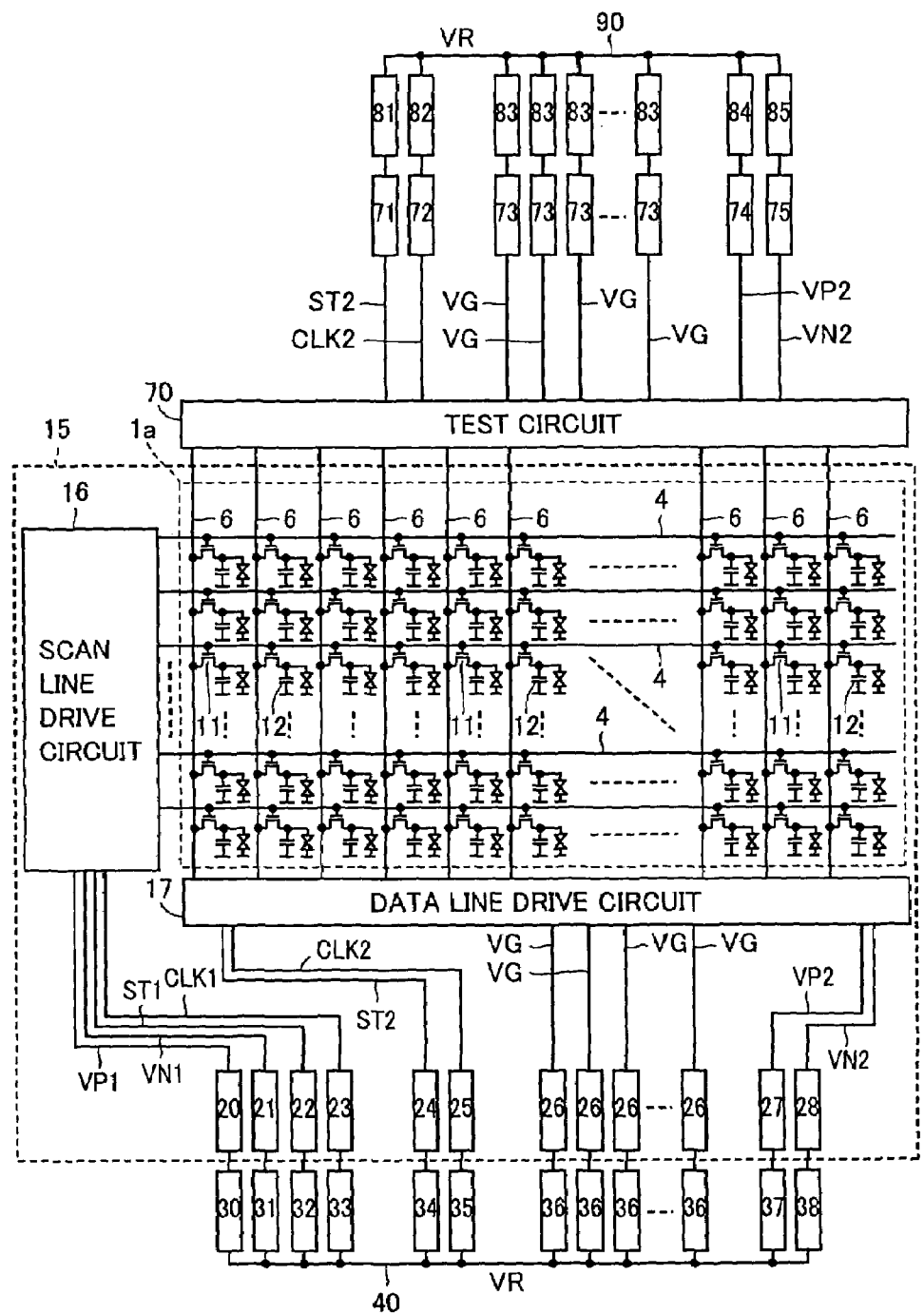
FIG. 7 is a circuit block diagram showing an exemplary modification of the present embodiment.

FIG. 7 is a circuit block diagram showing a modification of the present embodiment. Referring to FIG. 7, in this modification, a test circuit 70, a second start terminal 71, a second clock terminal 72, a plurality of data terminals 73, a second power supply terminal 74, a second negative power supply terminal 75, a plurality of protection circuits 81 to 85, and a reference potential line 90 are further provided outside of a module region of a glass substrate surface.

In the array inspection, test circuit 70 is driven by second positive power supply voltage VP2 and second negative power supply voltage VN2 applied through terminals 74 and 75. Test circuit 70 operates in synchronization with second start signal ST2 and second clock signal CLK2 applied through terminals 71 and 72. Test circuit 70 applies graduation potentials VGs applied through the plurality of data terminals 73 to a plurality of capacitors 12 corresponding to a selected scan line 4 to charge each capacitor 12. Then, test circuit 70 detects a discharge current of capacitor 12 and determines from the detection whether or not each capacitor 12 is normal.

The plurality of protection circuits 81 to 85 are provided respectively corresponding to terminals 71 to 75. Each of protection circuits 81 to 85 is connected between a corresponding terminal and reference potential line 90. Each of protection circuits 81 to 85 flows static electricity generated at the corresponding terminal to reference potential line 90 to protect test circuit 70 and LCD module 15. Reference potential line 90 is connected to a terminal for a reference potential (e.g. a ground potential GND terminal). Reference potential VR (e.g. ground potential GND) is applied to reference potential line 90. Protection circuits 81 to 85 are the same in configuration as protection circuits 34 to 38, respectively. Therefore, a current consumption of test circuit 70 can accurately be detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a first input terminal receiving a first positive voltage externally in an inspection of said semiconductor device and a normal operation of said semiconductor device;
an internal circuit connected to said first input terminal and performing a prescribed operation; at least a portion of said internal circuit is formed with a thin film transistor; and
a first protection circuit protecting said internal circuit from static electricity generated at said first input terminal,
said first protection circuit including
a plurality of first diode elements connected in series between said first input terminal and a line of a reference potential and conducting in response to a voltage of said first input terminal exceeding a second positive voltage higher than said first positive voltage, and
a second diode element connected between the line of said reference potential and said first input terminal and conducting in response to the voltage of said first input terminal going lower than a first negative voltage; wherein
each of said plurality of first diode elements and said second diode element is formed with a thin film transistor having its gate and drain connected together.

2. The semiconductor device according to claim 1, further comprising:
a second input terminal connected to said internal circuit and receiving a second negative voltage externally in the inspection of said semiconductor device and the normal operation of said semiconductor device; and
a second protection circuit protecting said internal circuit from static electricity generated at said second input terminal; wherein
said second protection circuit includes a plurality of third diode elements connected in series between the line of said reference potential and said second input terminal and conducting in response to a voltage of said second input terminal going lower than a third negative voltage lower than said second negative voltage, and
a fourth diode element connected between said second input terminal and the line of said reference potential and conducting in response to the voltage of said second input terminal exceeding a third positive voltage; and
each of said plurality of third diode elements and said fourth diode element is formed with a thin film transistor having its gate and drain connected together.

3. The semiconductor device according to claim 2, further comprising:
a third input terminal connected to said internal circuit and receiving externally a voltage of at most a fourth positive voltage and at least a fourth negative voltage in the inspection of said semiconductor device and the normal operation of said semiconductor device; and
a third protection circuit protecting said internal circuit from static electricity generated at said third input terminal; wherein
said third protection circuit includes
a plurality of fifth diode elements connected in series between said third input terminal and the line of said reference potential and conducting in response to the voltage of said first input terminal exceeding a fifth positive voltage higher than said fourth positive voltage, and
a plurality of sixth diode elements connected in series between the line of said reference potential and said third input terminal and conducting in response to a voltage of said third input terminal going lower than a fifth negative voltage lower than said fourth negative voltage; and
each of said plurality of fifth diode elements and said plurality of sixth diode elements is formed with a thin film transistor having its gate and drain connected together.

4. A semiconductor device comprising:
an input terminal receiving a first negative voltage externally in an inspection of said semiconductor device and a normal operation of said semiconductor device;
an internal circuit connected to said input terminal and performing a prescribed operation, at least a portion of said internal circuit is formed with a thin film transistor; and
a protection circuit protecting said internal circuit from static electricity generated at said input terminal,
said protection circuit including
a plurality of first diode elements connected in series between a line of a reference potential and said input terminal and conducting in response to a voltage of said input terminal going lower than a second negative voltage lower than said first negative voltage, and
a second diode element connected between said input terminal and the line of said reference potential and conducting in response to the voltage of said input terminal exceeding a predetermined positive voltage; wherein
each of said plurality of first diode elements and said second diode element is formed with a thin film transistor having its gate and drain connected together.

5. A semiconductor device comprising:

an input terminal receiving externally a voltage of at most a first positive voltage and at least a first negative voltage in an inspection of said semiconductor device and a normal operation of said semiconductor device;

an internal circuit connected to said input terminal and performing a prescribed operation, at least a portion of said internal circuit is formed with a thin film transistor; and a protection circuit protecting said internal circuit from static electricity generated at said input terminal, said protection circuit including a plurality of first diode elements connected in series between said input terminal and a line of a reference potential and conducting in response to a voltage of said input terminal exceeding a second positive voltage higher than said first positive voltage, and a plurality of second diode elements connected in series between the line of said reference potential and said input terminal and conducting in response to the voltage of said input terminal going lower than a second negative voltage lower than said first negative voltage; wherein each of said plurality of first diode elements and said plurality of second diode elements is formed with a thin film transistor having its gate and drain connected together.

6. A semiconductor device comprising:

a first input terminal receiving a first positive voltage externally in an inspection of said semiconductor device and a normal operation of said semiconductor device;

an internal circuit connected to said first input terminal and performing a prescribed operation;

a first protection circuit protecting said internal circuit from static electricity generated at said first input terminal, said first protection circuit including a plurality of first diode elements connected in series between said first input terminal and a line of a reference potential and conducting in response to a voltage of said first input terminal exceeding a second positive voltage higher than said first positive voltage, and a second diode element connected between the line of said reference potential and said first input terminal and conducting in response to the voltage of said first input terminal going lower than a first negative voltage;

a second input terminal connected said internal circuit and receiving a second negative voltage externally in the inspection of said semiconductor device and the normal operation of said semiconductor device;

a second protection circuit protecting said internal circuit from static electricity generated at said second input terminal, said second protection circuit including a plurality of third diode elements connected in series between the line of said reference potential and said second input terminal and conducting in response to a voltage of said second input terminal going lower than a third negative voltage lower than said second negative voltage, and a fourth diode element connected between said second input terminal and the line of said reference potential and conducting in response to the voltage of said second input terminal exceeding a third positive voltage;

a third input terminal connected to said internal circuit and receiving externally a voltage of at most a fourth positive voltage and at least a fourth negative voltage in the inspection of said semiconductor device and the normal operation of said semiconductor device; and a third protection circuit protecting said internal circuit from static electricity generated at said third input terminal, said third protection circuit including a plurality of fifth diode elements connected in series between said third input terminal and the line of said reference potential and conducting in response to the voltage of said first input terminal exceeding a fifth positive voltage higher than said fourth positive voltage, and a plurality of sixth diode elements connected in series between the line of said reference potential and said third input terminal and conducting in response to a voltage of said third input terminal going lower than a fifth negative voltage lower than said fourth negative voltage.

7. The semiconductor device according to claim 1, wherein said semiconductor device is formed on one substrate, and a portion of the substrate having said first protection circuit formed thereon is isolated from a portion of the substrate having said first input terminal and said internal circuit formed thereon after the inspection of said semiconductor device.

8. The semiconductor device according to claim 7, wherein said semiconductor device forms a portion of a liquid crystal display device, and said internal circuit includes a thin film transistor array, a scan line drive circuit and a data line drive circuit.

* * * * *